(12) United States Patent  (10) Patent No.: US 8,310,066 B2
Sasaki  (45) Date of Patent: Nov. 13, 2012

(54) SEMICONDUCTOR APPARATUS

(75) Inventor: Kou Sasaki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 508 days.

(21) Appl. No.: 12/222,601

(22) Filed: Aug. 12, 2008

(65) Prior Publication Data

US 2009/0057925 A1  Mar. 5, 2009

(30) Foreign Application Priority Data

Aug. 28, 2007 (JP) ................. 2007/221426

(51) Int. Cl.
*H01L 23/48* (2006.01)
(52) U.S. Cl. ............. 257/784; 257/777; 257/E23.141
(58) Field of Classification Search .......... 257/254, 257/415, 730, E21.521, E23.045, 48, 486, 257/781, 784, 786, 777, E23.141; 438/11, 438/14, 15, 50, 18, 614
See application file for complete search history.

(56) References Cited

U.S. PATENT DOCUMENTS

| | | | |
|---|---|---|---|
| 7,247,921 B2 | 7/2007 | Sugiura et al. | |
| 7,397,103 B2 * | 7/2008 | Archer et al. | 257/484 |
| 2004/0085099 A1 * | 5/2004 | Ratchkov et al. | 327/100 |
| 2005/0212147 A1 * | 9/2005 | Nishizawa | 257/786 |
| 2005/0275076 A1 | 12/2005 | Sugiura et al. | |
| 2006/0189007 A1 * | 8/2006 | Aoki et al. | 438/14 |
| 2007/0257353 A1 * | 11/2007 | Park | 257/690 |

FOREIGN PATENT DOCUMENTS

| | | |
|---|---|---|
| JP | 3-272143 (A) | 12/1991 |
| JP | 4-199651 (A) | 7/1992 |
| JP | 6-244254 | 9/1994 |
| JP | 2005-277338 | 10/2005 |
| JP | 2005-353815 | 12/2005 |
| JP | 2007-165392 (A) | 6/2007 |

OTHER PUBLICATIONS

Notification of Reason(s) for Refusal dated May 1, 2012, with English translation.
Notification of Reasons for Refusal dated Jul. 17, 2012, with English-language translation.

* cited by examiner

*Primary Examiner* — Cuong Q Nguyen
*Assistant Examiner* — Yosef Gebreyesus
(74) *Attorney, Agent, or Firm* — McGinn IP Law Group, PLLC

(57) ABSTRACT

A semiconductor apparatus capable of detecting a crack generated in a semiconductor chip while the design freedom, the layout freedom of a wiring, the layout efficiency of LSI, and the layout efficiency of a package substrate are improved. The semiconductor apparatus according to the invention includes a semiconductor chip having a multilayered wiring structure; plural electrode pads being formed on a top surface along the outer periphery of the semiconductor chip; and a wiring being coupled to a first electrode pad and a second electrode pad selected from the plural electrode pads and formed along the entire outer periphery of the semiconductor chip in plan view. The wiring includes a first wiring and a second wiring that are formed on different layers, and the first wiring and the second wiring are connected in series by a connection plug.

15 Claims, 7 Drawing Sheets

SEMICONDUCTOR APPARATUS

FIELD OF THE INVENTION

The present invention relates to a semiconductor apparatus that is capable of detecting a crack generated in a semiconductor chip.

BACKGROUND OF THE INVENTION

In case of a semiconductor apparatus according to the related art, as shown in FIG. 6, a crack 120 may be generated in a semiconductor chip 110 due to stress that occurs during a cutting process, a mounting process, or a heating process.

JP-A-Hei6(1994)-244254, JP-A-2005-277338, and JP-A-2005-353815 disclose the solving means for the above-mentioned problem. The above Patent Documents disclose an example of a semiconductor apparatus that is mounted on a package substrate 124.

Referring to FIG. 7, the package substrate 124 includes plural electrode pads 126 that is provided along the outer periphery thereof. Further, a semiconductor chip 110 includes plural electrode pads 112 that is provided along the outer periphery. The electrode pads 126 and the electrode pads 112 are connected to each other by a bonding wire 130.

The semiconductor chip 110 further includes a wiring 118 provided between the electrode pads 112 and the outer periphery of the semiconductor chip 110 to connect the adjacent electrode pads 112a and 112b. The electrode pads 112a of the semiconductor chip 110 and the electrode pad 126a of the package substrate 124a reconnected to each other by a bonding wire 130. Similarly, the electrode pad 112b and the electrode pad 126b are connected to each other by the bonding wire 130.

When a crack 120 is generated in the semiconductor chip 110, this causes the wiring 118 to be disconnected. In this case, a resistance between the electrode pad 126a and the electrode pad 126b is changed, which allows the crack 120 to be detected.

Further, JP-A-Hei6(1994)-244254 discloses that both ends of a conductor pattern are convoluted to each other, and two measuring electrode pads connected at the both ends of the conductor pattern are formed at one edge.

Furthermore, JP-A-Hei6(1994)-244254 and JP-A-2005-277338 disclose that on a layer other than the uppermost layer of a multilayered semiconductor chip, plural wirings are formed along the outer periphery of the semiconductor chip 110, and connected to each other directly below the electrode pads 126a and 126b by a plug.

SUMMARY

However, the related arts disclosed in JP-A-Hei6(1994)-244254, JP-A-2005-277338, and JP-A-2005-353815 need to use adjacent electrode pads 112a and 112b as a detecting pad. But, it is difficult to use a desired electrode pad 112, which restricts the design freedom.

That is, the plural wirings that is formed on the layer other than the uppermost layer of the multilayered semiconductor chip is formed to have multiple layers having the same shape and connecting the layers directly below the electrode pad. With this configuration, it is difficult to install the wirings at a preferable location, and the layout freedom of the wirings, the layout efficiency of LSI, and the layout efficiency of the package substrate may be restricted.

A semiconductor apparatus according to an aspect of the invention includes a semiconductor chip having a multilayered wiring structure, plural electrode pads formed along the outer periphery of the semiconductor chip on the top surface of the semiconductor chip, and a wiring that is connected to two electrode pads selected from the plural electrode pads and formed along the entire outer periphery of the semiconductor chip in plan view. The wiring may include a first wiring and a second wiring that are formed on different layers, and the first wiring and the second wiring may be connected in series by a connection plug.

According to the aspect of the invention, the wiring may include a first wiring and a second wiring that are formed on different layers, and the first wiring and the second wiring may be connected in series by a connection plug.

With this configuration, since it is possible to dispose the wiring at a predetermined location, predetermined two electrode pads that are arbitrarily selected from the plural electrode pads may be used. Therefore, the design freedom of the semiconductor apparatus may be improved.

Further, with this configuration, it is possible to dispose the wiring at a predetermined location, which improves the layout freedom of a wiring, the layout efficiency of LSI, and the layout efficiency of a package substrate.

As described in Patent Documents, when a wiring disposed in the semiconductor chip is formed only on a single layer or the uppermost layer, it is difficult to identify whether the wiring is disconnected due to the stress caused by the temperature cycle or disconnected due to a crack. However, according to the invention, since the layout freedom of a wiring is improved, a lower wiring can be used instead of an upper wiring disposed at a corner. Therefore, it is possible to prevent sliding of the metal wiring, disconnection or a short circuit, which enhances the ability to precisely specify the cause of the malfunction of the semiconductor apparatus.

According to the invention, it is possible to provide a semiconductor apparatus that is capable of detecting a crack generated in a semiconductor chip while the design freedom, the layout freedom of a wiring, the layout efficiency of LSI, and the layout efficiency of a package substrate are improved.

DETAILED DESCRIPTION OF THE PREFERRED EMBODIMENTS

Figure 1:
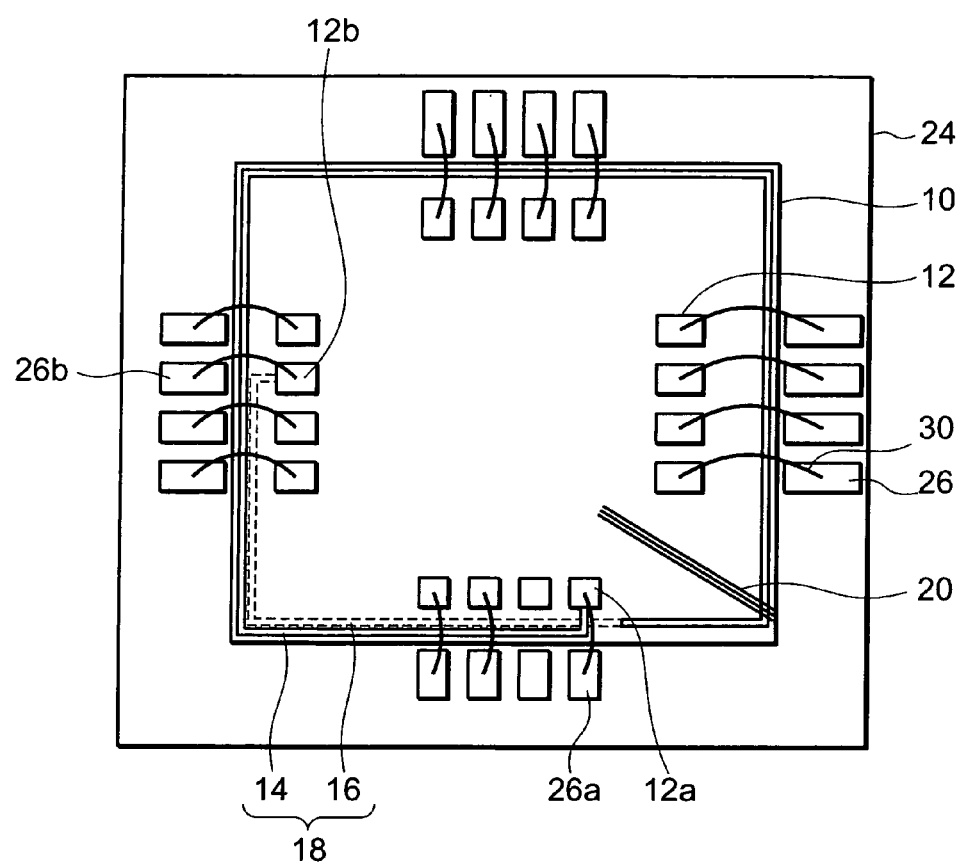
FIG. 1 is a schematic top view of a semiconductor apparatus according to a first embodiment of the invention.

Hereinafter, exemplary embodiments of the invention will be described with reference to drawings. Like reference numerals designate like elements throughout the specification, and the description thereof will be omitted.

Hereinafter, first to third embodiments will be described by turns.

First Embodiment

A semiconductor apparatus according to a first embodiment will be described with reference to a schematic top view shown in FIG. 1 and a perspective view shown in FIG. 2. Further, FIG. 2 shows only plural electrode pads 12, a connection plug 15, and a wiring 18.

Figure 2:
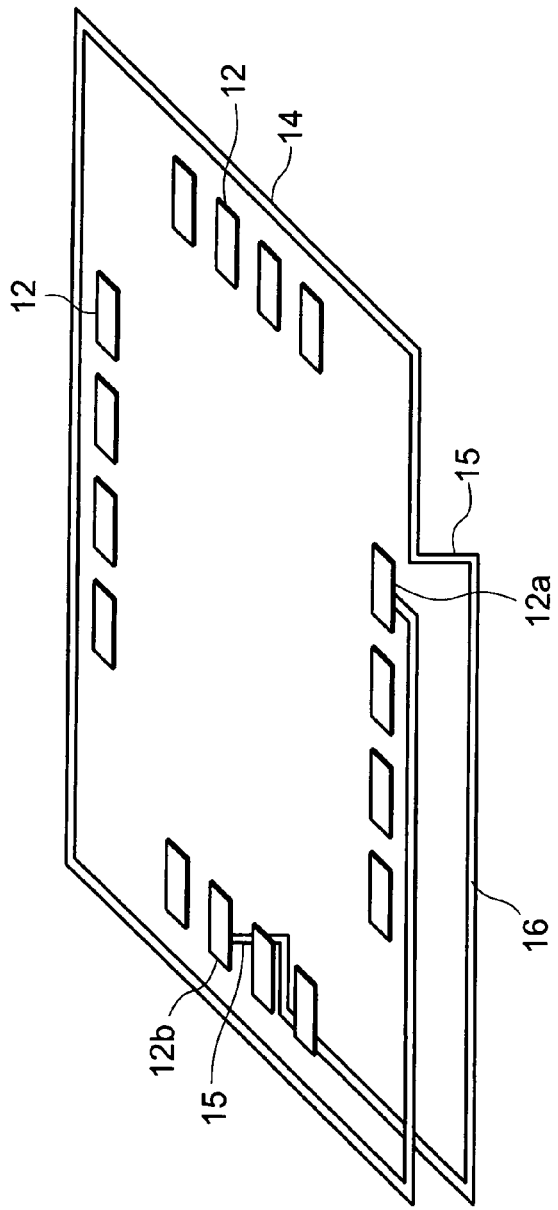
FIG. 2 is a perspective view of the semiconductor apparatus according to the first embodiment of the invention.

As shown in FIG. 1, the semiconductor apparatus according to the first embodiment is mounted on a package substrate 24. The package substrate 24 includes plural electrode pads 26 formed along the outer periphery on the top surface of the package substrate.

The semiconductor apparatus includes a semiconductor chip 10 having a multilayered wiring structure, plural electrode pads 12 formed along the outer periphery on the top surface of the semiconductor chip 10, and the wiring 18.

The semiconductor chip 10 may be any one of a logic IC, a memory IC, and a mixture those of.

The electrode pads 12 are connected to an internal circuit of the semiconductor chip 10, and include an electrically floated pad. A first electrode pad 12a and a second electrode pad 12b that are selected from the plural electrode pads 12 are connected to the wiring 18. The first electrode pad 12a and the second electrode pad 12b are not inspection pads that are specifically made for inspection, but are arbitrarily selected from the plural electrode pads 12.

The first electrode pad 12a and the second electrode pad 12b that are connected to the wirings 18 are disposed at the different edges of the rectangular semiconductor chip 10.

The wiring 18 is formed along the entire outer periphery of the semiconductor chip 10 in plan view, and disposed between the outer peripheral edge of the semiconductor chip 10 and the electrode pads 12 in plan view. The wiring 18 is arranged to encircle by more than a full circle the outer periphery of the semiconductor chip 10.

Therefore, when the crack 20 is generated in the semiconductor chip 10, the wiring 18 between the first electrode pad 12a and the second electrode pad 12b is disconnected. Accordingly, the generation of the crack 20 can be checked by measuring a resistance between the first electrode pad 12a and the second electrode pad 12b.

The wiring 18 includes a first wiring 14 and a second wiring 16. The first wiring 14 and the second wiring 16 are formed on the different layers, as shown in FIG. 2.

According to the first embodiment, the first wiring 14 is formed on the uppermost layer. In contrast, the second wiring 16 is preferably formed on a layer that is directly below the first wiring 14, or formed with one or more layers interposed therebelow.

As shown in FIG. 2, an end of the first wiring 14 and an end of the second wiring 16 are connected in series by the connection plug 15. The other end of the first wiring 14 is connected to the first electrode pad 12a, and the other end of the second wiring 16 is connected to the second electrode pad 12b by the connection plug 15. Therefore, the first electrode pad 12a and the second electrode pad 12b are electrically connected to each other.

The first wiring 14 and the second wiring 16 contain a metal such as Al. Further, when the second wiring 16 is disposed on the lowermost layer of the semiconductor chip 10, a polysilicon resistor may be used as the second wiring 16. The width of the first wiring 14 and the second wiring 16 may be larger than the width of the internal signal wiring.

As shown in FIG. 1, the first electrode pad 26a and the second electrode pad 26b of the package substrate 24a reconnected to the first electrode pad 12a and the second electrode pad 12b by the bonding wire 30. With this configuration, the first electrode pad 26a and the second electrode pad 26b are electrically connected to each other.

Hereinafter, the effect of the first embodiment will be described.

In the semiconductor apparatus according to the first embodiment, the wiring 18 that is connected to the first electrode pad 12a and the second electrode pad 12b is disposed along the entire outer periphery of the semiconductor chip 10 in plan view.

Therefore, if the crack is generated in the semiconductor chip 10, the wiring between the first electrode pad 12a and the second electrode pad 12b is surely disconnected. As a result, by measuring the resistance between the first electrode pad 12a and the second electrode pad 12b, it is possible to efficiently detect the generation of the crack 20.

Further, the wiring 18 includes the first wiring 14 and the second wiring 16 that are formed on the different layers, and the first wiring 14 and the second wiring 16 are connected in series by the connection plug 15.

With this configuration, it is possible to dispose the wiring 18 on a desired position, and thus predetermined two electrode pads that are arbitrarily selected from the plural electrode pads 12 can be used.

Therefore, the design freedom of the semiconductor apparatus is improved. Further, with this configuration, it is possible to dispose the wiring at an arbitrary location, and thus the layout freedom of the wiring, the layout efficiency of LSI, and the layout efficiency of the package substrate may be improved.

In case of the semiconductor apparatus according to the related art disclosed in JP-A-Hei6(1994)-244254, JP-A-2005-277338, and JP-A-2005-353815, electrode pads that are adjacent to each other at the same edge of the semiconductor chip are used as inspection electrode pads. Therefore, when the adjacent electrode pads are used as inspection electrode pads, and the inspection electrode pads are connected to each other on a single layer or the same layer by a wiring, an area where the wiring is cut, that is, an area where disconnection (crack) is not detected may be minimized.

In the meantime, if an inspection wiring using two electrode pads that are not adjacent to each other, for example, electrode pads that are disposed at different edges of the semiconductor chip, is provided, the design freedom of the semiconductor apparatus is preferably improved. Accordingly, in the semiconductor apparatus according to the related art, when two electrode pads that are not adjacent to each other are used, wirings cannot be provided along the entire outer periphery of the semiconductor chip, and an area where the wiring is cut, that is, an area where disconnection (crack) is not detected may be increased. As a result, the probability that detects the crack is lowered.

In contrast, in case of the semiconductor apparatus according to the first embodiment, as the wiring 18, the first wiring 14 and the second wiring 16, which are formed on different layers, are connected in series by the connection plug 15. With this configuration, it is possible to freely install wirings on a lower layer, in addition to on the top layer. Therefore, the layout freedom of wirings is improved. As a result, even though the first electrode pad 12a and the second electrode pad 12b that are not adjacent to each other, the pads may be used as inspection pads.

According to the first embodiment, the first wiring 14 is formed on the uppermost layer. With this configuration, since the second wiring 16 is not disposed on the uppermost layer, it is possible to prevent disconnection due to migration or hillock of aluminum, which improves the reliability of the semiconductor apparatus.

Further, any one of the first electrode pad 12a and the second electrode pad 12b may be connected to only the wiring 18.

That is, one end of the wiring 18 to which the electrode pad is not connected can be connected to a terminal (including pull-up/pull-down), such as VDD or GND, whose function is previously determined.

When both ends of the wiring 18 are connected to electrode pads that are electrically floated, it is required to apply a voltage between the electrode pads to confirm disconnection of the wiring 18. However, with this configuration, the output of the electrode pads 12 that are connected to only the wiring 18 can be detected, which makes it possible to easily confirm disconnection of the wiring 18.

According to the first embodiment, the first electrode pad 12a and the second electrode pad 12b that are electrically connected to the wiring 18 are disposed at the different edges of the rectangular semiconductor chip 10.

The semiconductor apparatus according to the related art uses a specific inspection electrode pad, as described in JP-A-Hei6(1994)-244254, JP-A-2005-277338, and JP-A-2005-353815. The inspection electrode pad is specifically manufactured to inspect for cracks. Therefore, for the convenience sake of the inspection, the inspection electrode pads are provided along the same edge of the semiconductor chip. However, in the semiconductor apparatus according to the first embodiment, the first wiring 14 and the second wiring 16 are connected in series to each other by the connection plug 15, and the wirings are freely installed not only on the upper layer, but also on the lower layer. Accordingly, the layout freedom and the layout efficiency of the wiring 18 are improved.

As a result, it is possible to dispose the first electrode pad 12a and the second electrode pad 12b at the different edges of the semiconductor chip 10.

According to the first embodiment, the first wiring 14 and the second wiring 16 overlap each other at least partially in plan view. The first wiring 14 and the second wiring 16 may overlap each other at a space between the two electrode pads.

Therefore, it is possible to reduce the space that is occupied by the wirings in plan view, which increases the space efficiency of the chip. Further, since there is a location where the first wiring 14 and the second wiring 16 are laminated, the ability of detecting the crack 20 may be improved.

Second Embodiment

Figure 3:
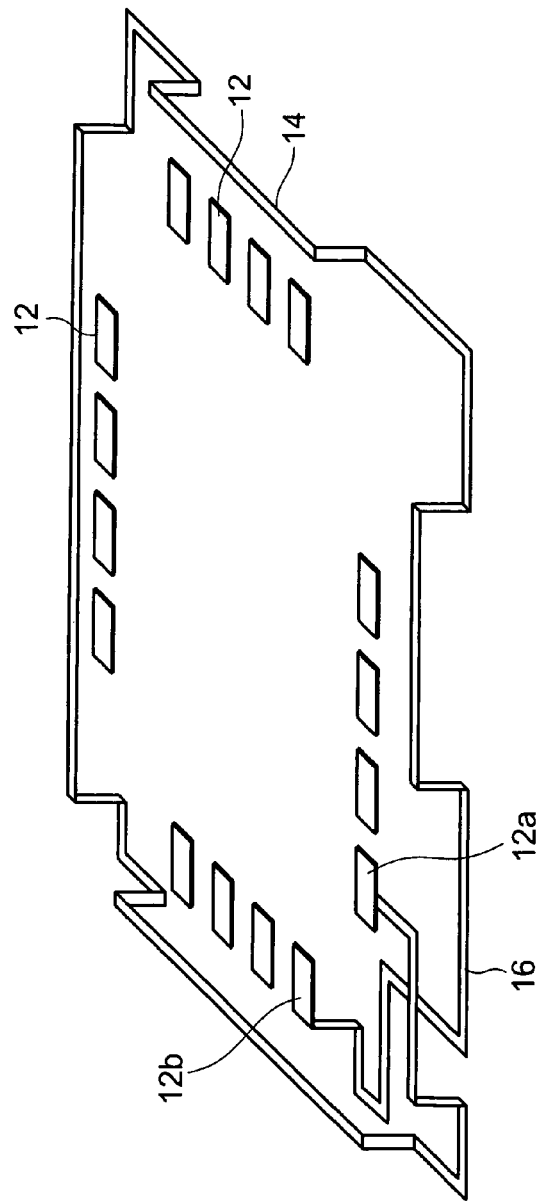
FIG. 3 is a perspective view of a semiconductor apparatus according to a second embodiment of the invention.

According to a second embodiment, as shown in FIG. 3, a second wiring 16 that is formed on a lower layer than that of a first wiring 14 is disposed at a corner of a rectangular semiconductor chip 10. The first wiring 14 that is provided on the uppermost layer is not provided at the corner. The wiring 18 contains at least one of Al, AlCu, Cu, AlSiCu, and so forth.

The semiconductor apparatus according to the second embodiment has the following effect in addition to the same effect as the first embodiment.

According to the second embodiment, at the corner of the semiconductor chip 10, the second wiring 16 is disposed on a layer other than the uppermost layer. Therefore, it is possible to prevent the metal wiring 18 from sliding.

Since the rates of expansion between the package substrate and the resin are different due to the intermittent thermal stress that occurs when using the semiconductor apparatus, a warpage may be generated on the entire package. Since the warpage is significant at the corner, the influence on the wiring formed on the uppermost layer that is close to a mold layer becomes larger, for example, the stress is concentrated thereon and sliding of metal wiring may occur.

However, in the semiconductor apparatus according to the related art as disclosed in the above Patent Documents, the wiring is installed on the single layer or the same layer. Further, it is difficult to distinguish between disconnection caused by sliding of the metal wiring due to the temperature stress and the pellet crack.

In contrast, according to the second embodiment, the first wiring 14 and the second wiring 16 are connected in series by the connection plug 15, and the wirings are freely installed not only on the upper layer, but also on the lower layer. Therefore, the second wiring 16 may be installed on a layer other than the uppermost layer, which prevents the generation of the metal wiring sliding of the wiring 18. Further, it is possible to prevent disconnection or a short circuit. As a result, it is possible to enhance the ability to precisely specify the cause of the malfunction of the semiconductor apparatus.

According to the second embodiment, the second wiring 16 is disposed at least one corner of the rectangular semiconductor chip 10, and on a layer lower than the first wiring 14. Further, the first electrode pad 12a and the second electrode pad 12b that are connected to the wiring 18 are formed along different edges of the rectangular semiconductor chip 10.

According to the second embodiment, the first wiring 14 and the second wiring 16 are connected in series by the connection plug 15, and are freely installed not only on the upper layer, but also on the lower layer. Therefore, the layout freedom of the wiring 18 is improved. Accordingly, even though any of the first electrode pad 12a and the second electrode pad 12b is selected from the electrode pad 12, sliding of the metal wiring, disconnection or a short circuit is surely prevented, which enhances the ability to precisely specify the cause of the malfunction of the semiconductor apparatus.

Third Embodiment

Figure 4:
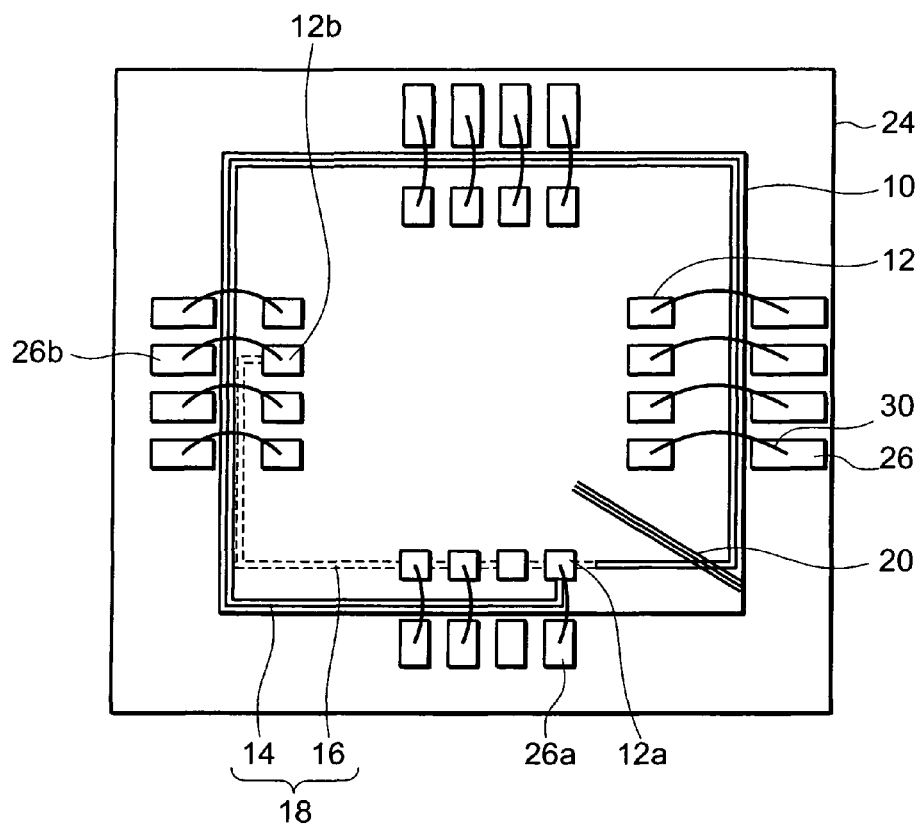
FIG. 4 is a schematic top view of a semiconductor apparatus according to a third embodiment of the invention.

According to a third embodiment, as shown in FIG. 4, a second wiring 16 is disposed directly below electrode pads 12 that are provided along an edge of a semiconductor chip 10.

The semiconductor apparatus according to the third embodiment has the following effect in addition to the same effect as the first embodiment and the second embodiment.

According to the third embodiment, a part of the second wiring 16 is disposed directly below the electrode pad 12. Therefore, it is possible to heat the second wiring 16 to perform the inspection of the product reliability during the self heating of the semiconductor chip 10. As a result, a measurement device is not needed during the inspection of the self-heating.

The second wiring 16 is quadruply folded longitudinally such that the second wiring 16 having a width of 50 μm or so is quadruply wound directly below the electrode pads 12. Therefore, the width of the wiring is 200 μm (50 μm×4), and the current that flows there through may be 1A. By longitudinally folding the second wiring 16 with four layers, the self-heating test can be performed even if the internal voltage is included.

When only one electrode pad is connected only to the wiring 18, the electrode pad depends on the absolute maximum rated voltage of the internal elements of the semiconductor chip 10. Therefore, the resistance needs to be low. As a result, when the electrode pad is connected to wirings that are longitudinally parallel to each other over the plural layers, the self-heating test can be efficiently performed.

In the meantime, when any one of the first electrode pad 12a and the second electrode pad 12b is connected only to the wiring 18, a polysilicon resistive layer that is formed on the semiconductor substrate of the semiconductor chip 10 can be used as the second wiring 16 directly below the electrode pad 12.

Accordingly, since the electrode pad is not connected into the semiconductor chip 10, it is not necessary to consider the rated voltage of the internal power supply. Further, it is possible to apply a high voltage as long as the physical shape of the wirings is maintained. Therefore, the wiring resistance is preferably large, for example, a polysilicon resistive layer that has a larger resistivity than a metal wiring can be used. By using the polysilicon resistive layer, the high voltage is applied to cause self-heating and perform the test.

Fourth Embodiment

Figure 5:
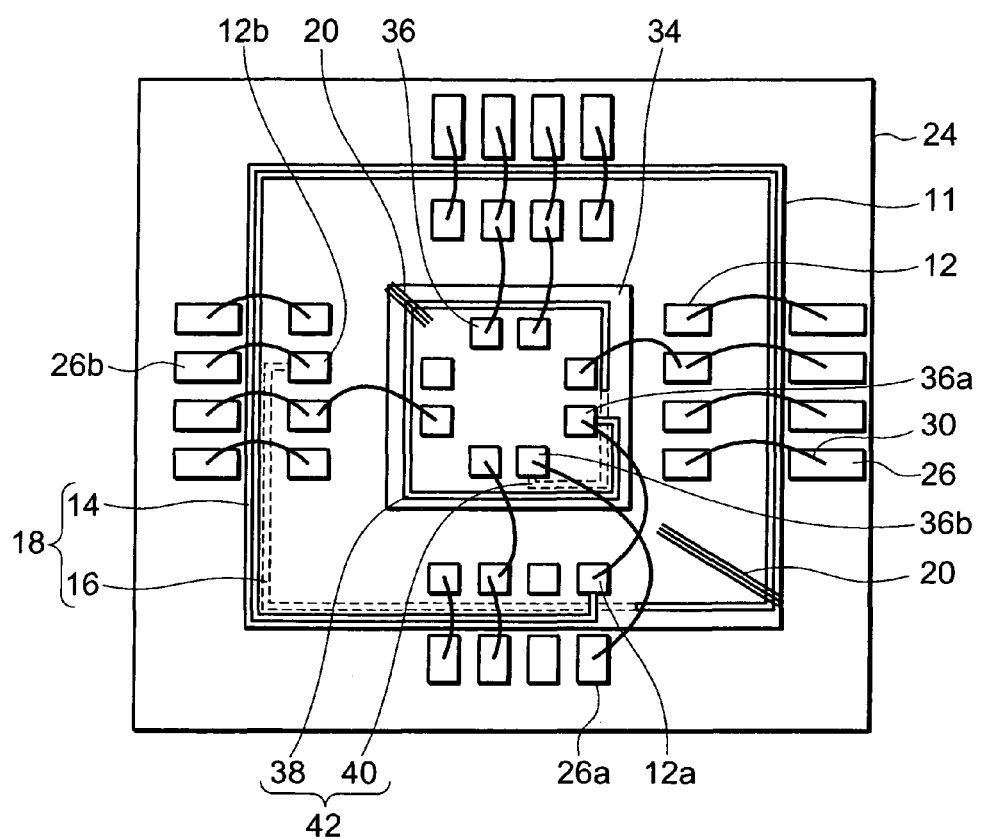
FIG. 5 is a schematic top view of a semiconductor apparatus according to a fourth embodiment of the invention.
Figure 6:
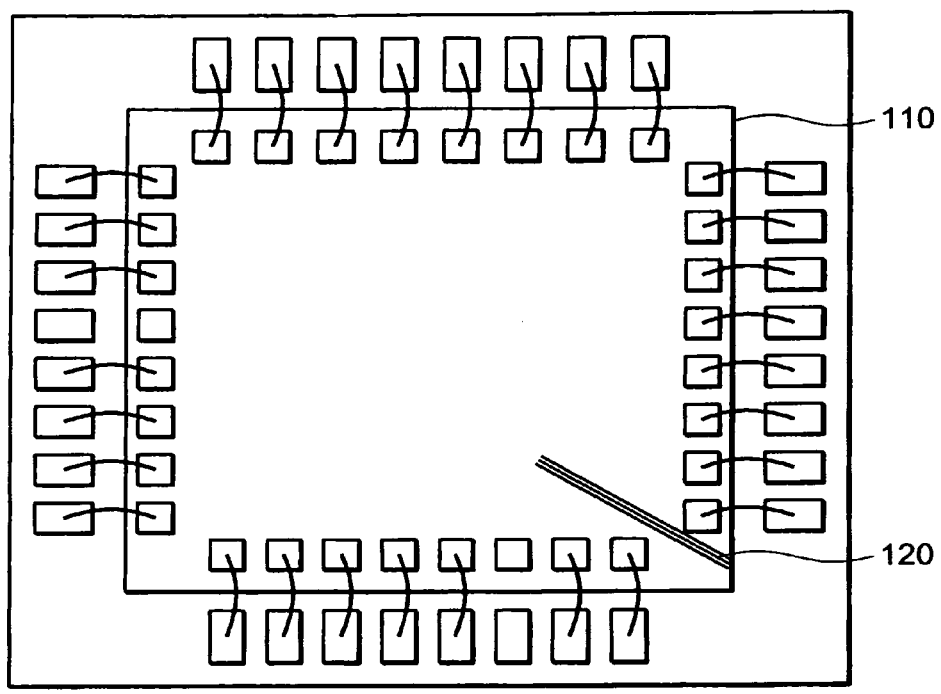
FIG. 6 is a schematic top view of a semiconductor apparatus according to the related art.
Figure 7:
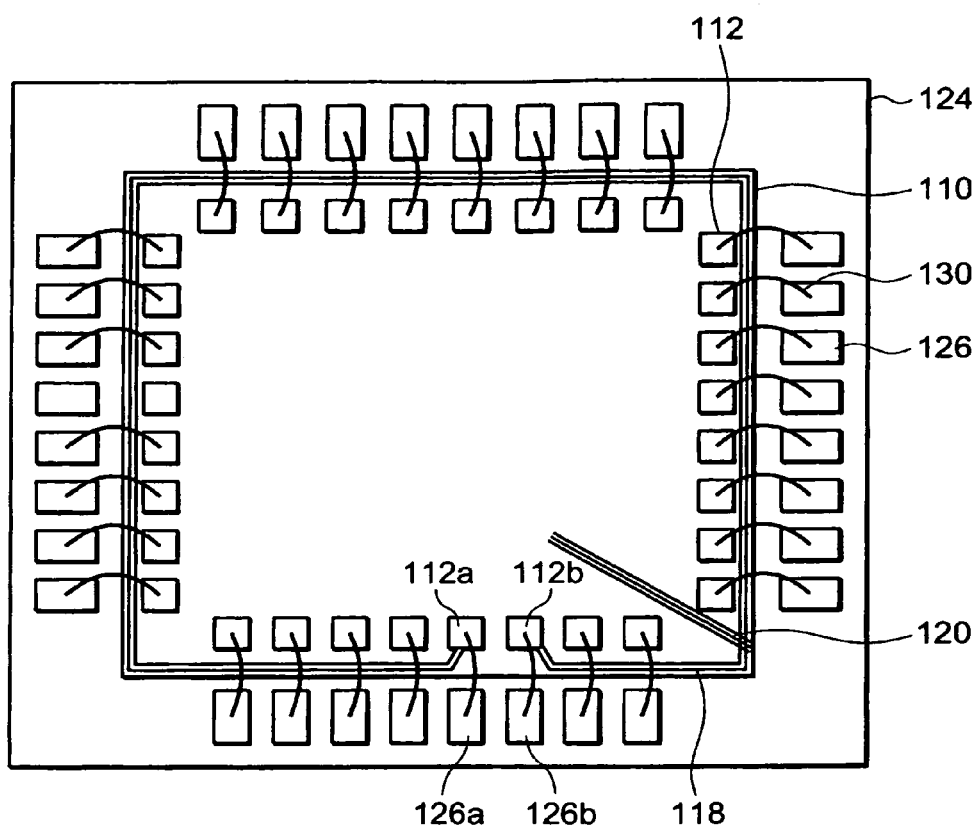
FIG. 7 is a schematic top view of a semiconductor apparatus according to the related art.

According to a fourth embodiment, as shown in FIG. 5, a wiring 18 of a first semiconductor chip 11 and a wiring 42 of a second semiconductor chip 34 are connected in parallel to each other by a first electrode pad 12a and a first electrode pad 36a. The first semiconductor chip 11 and the second semiconductor chip 34 are laminated on a package substrate 24.

As for the first semiconductor chip 11 and the second semiconductor chip 34, the semiconductor chip 10 according to any one of the first to third embodiments can be used.

The first semiconductor chip 11 includes plural electrode pads 12 formed along the outer periphery thereof and a wiring 18. The wiring 18 is connected to a first electrode pad 12a and a second electrode pad 12b that are arbitrarily selected from the plural electrode pads 12, and provided along the entire outer periphery of the first semiconductor chip 11 in plan view. The wiring 18 includes a first wiring 14 and a second wiring 16. The first wiring 14 and the second wiring 16 are connected in series by a connection plug.

The second semiconductor chip 34 includes plural electrode pads 36 formed along the outer periphery thereof and a wiring 42. The wiring 42 is connected to a first electrode pad 36a and a second electrode pad 36b that are arbitrarily selected from the plural electrode pads 36, and provides along the entire outer periphery of the second semiconductor chip 34 in plan view. The wiring 42 includes a first wiring 38 and a second wiring 40. The first wiring 38 and the second wiring 40 are connected in series by a connection plug.

A first electrode pad 26a formed on the package substrate 24 is connected to the second electrode pad 36b of the second semiconductor chip 34 by a bonding wire 30. The first electrode pad 36a is connected to the first electrode pad 12a of the first semiconductor chip 11 by the bonding wire 30. The second electrode pad 12b of the first semiconductor chip 11 is connected to the second electrode pad 26b of the package substrate 24 by the bonding wire 30.

According to the fourth embodiment, a resistance between the first electrode pad 26a and the second electrode pad 26b is measured. When a crack 20 is generated on the first semiconductor chip 11 or the second semiconductor chip 34, and the wiring 18 or the wiring 42 is disconnected, the resistance is changed. Therefore, by measuring the resistance, the crack 20 can be detected.

The semiconductor apparatus according to the fourth embodiment has the following effect in addition to the same effect as the first to third embodiments.

The semiconductor apparatus according to the related art needs to separately measure every semiconductor chip in order to detect the generation of the crack of the semiconductor chip. Therefore, when the semiconductor chips are laminated, it is difficult to detect the generation of the crack.

In contrast, according to the semiconductor apparatus of the fourth embodiment, the first wiring 14 and the second wiring 16 are connected in series by the connection plug 15, and the wirings are freely installed not only on the upper layer, but also on the lower layer. Therefore, the layout freedom of the wiring 18 is high. Further, since the wirings of the plural semiconductor chips are connected in series to each other, as compared when the resistance between two electrode pads is measured, the generation of the crack on the plural semiconductor chips can be easily detected at a time.

Even though the exemplary embodiments of the invention are described with reference to the drawings, the embodiments are illustrative in all aspects of the invention, and the various modifications or changes can be made.

For example, in any of the above embodiment, the first wiring 14 and the second wiring 16 may contain a metal such as Al, Cu, and so forth.

Further, in any of the above embodiments, the first wiring 14 may be disposed on a higher layer than the second wiring 16, but may not be disposed on the uppermost layer.

Furthermore, in any of the above embodiments, the wiring 18 of the semiconductor chip 10 may be formed with three or more layers.

In any of the above embodiments, the first electrode pad 12a and the second electrode pad 12b may be formed along the same edge of the rectangular semiconductor chip 10, or adjacent to each other.

In any of the above embodiments, the first wiring 14 can be formed on a layer other than the uppermost layer. With the arrangement of the first wiring 14, disconnection or sliding of the metal wiring caused by the migration or hillock of aluminum can be effectively prevented, and disconnection or a short circuit can be prevented. As a result, it is possible to enhance the ability to precisely specify the cause of the malfunction of the semiconductor apparatus.

According to the first, second, and fourth embodiments, the second wiring 16 may be formed inside the electrode pads 12 of the semiconductor chip 10 in plan view.

According to the second embodiment, even though at all the corners of the semiconductor chip 10, only the second wiring 16 is provided, only the second wiring 16 may be formed at least one corner.

According to the third embodiment, the second wiring 16 may be formed directly below the electrode pads 12 that are formed along two or more edges of the semiconductor chip 10. With the arrangement of the second wiring 16, it is possible to efficiently perform the test of product reliability during the self-heating of the semiconductor chip 10.

Further, according to the fourth embodiment, the plural semiconductor chips may be mounted in parallel to each other on the package substrate.

Furthermore, according to the fourth embodiment, the semiconductor chip may be laminated with three or more layers.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor apparatus comprising:
   a semiconductor chip having a multilayered wiring structure;
   a plurality of electrode pads formed on a top surface of the semiconductor chip and along the outer periphery of said semiconductor chip; and
   a wiring coupled to two electrode pads selected from said plurality of electrode pads, arranged to encircle by more than a full circle the outer periphery of said semiconductor chip, and a plurality of wirings between said two electrode pads in plan view,
wherein said plurality of wirings includes a first wiring formed on an upper layer and a second wiring formed on a lower layer,
wherein said first wiring and said second wiring are connected in series by a connection plug,
wherein said second wiring is disposed at every corner of said semiconductor chip, and
wherein said two electrode pads coupled to said wiring are formed along different edges of said semiconductor chip.

2. The semiconductor apparatus according to claim 1, wherein said first wiring is formed on an uppermost layer.

3. The semiconductor apparatus according to claim 1, wherein at least one of said plurality of electrode pads, which are coupled to said wiring, is coupled only to said wiring.

4. The semiconductor apparatus according to claim 3, wherein said first wiring and said second wiring overlap at least partly in plan view.

5. The semiconductor apparatus according to claim 4, wherein at least a part of said second wiring is formed directly below at least one of said plurality of electrode pads.

6. A semiconductor apparatus, according to claim 5, wherein a plurality of semiconductor chips including the semiconductor chip are mounted on a substrate, and all of said wirings formed on said plurality of semiconductor chips respectively are connected in series by coupling said electrode pads.

7. The semiconductor apparatus according to claim 1, wherein said first wiring and said second wiring overlap at least partly in plan view.

8. The semiconductor apparatus according to claim 7, wherein at least a part of said second wiring is formed directly below at least one of said plurality of electrode pads.

9. A semiconductor apparatus, according to claim 8, wherein a plurality of semiconductor chips including the semiconductor chip are mounted on a substrate, and all of said wirings formed on said plurality of semiconductor chips respectively are connected in series by coupling said electrode pads.

10. The semiconductor apparatus, as claimed in claim 1, wherein the first wiring is overlapped with the second wiring at a space between the two electrode pads.

11. The semiconductor apparatus, as claimed in claim 1, wherein the first wiring and the second wiring are provided with the different layers at a space between the two electrode pads.

12. A semiconductor apparatus, comprising:
a semiconductor chip;
a plurality of electrode pads formed on a top surface of the semiconductor chip and along an outer periphery of said semiconductor chip; and
a wiring coupled between two electrode pads selected from said plurality of electrode pads and arranged to encircle by more than a full circle the outer periphery of said semiconductor chip in plan view,
wherein the wiring includes a first wiring formed on an upper layer and a second wiring formed on a lower layer,
wherein the second wiring is disposed at every corner of the semiconductor chip, and
wherein the two electrode pads are formed along different edges of the semiconductor chip.

13. The semiconductor apparatus, as claimed in claim 12, wherein the wiring is overlapped at a space between the two electrode pads.

14. The semiconductor apparatus, as claimed in claim 12, wherein the wiring is provided with different layers at a space between the two electrode pads.

15. The semiconductor apparatus, as claimed in claim 12, wherein the wiring encircles, by more than a full circle, the outer periphery of the semiconductor chip in order to detect a crack generated at any outer periphery of the semiconductor chip.

* * * * *